(12) United States Patent
Caillat et al.

(10) Patent No.: US 6,453,553 B1
(45) Date of Patent: Sep. 24, 2002

(54) METHOD FOR MAKING AN ANISOTROPIC CONDUCTIVE COATING WITH CONDUCTIVE INSERTS

(75) Inventors: Patrice Caillat, Echirolles; Claude Massit, St. Ismier, both of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/463,228

(22) PCT Filed: Jul. 20, 1998

(86) PCT No.: PCT/FR98/01586
§ 371 (c)(1),
(2), (4) Date: Feb. 14, 2000

(87) PCT Pub. No.: WO99/05717
PCT Pub. Date: Feb. 4, 1999

(30) Foreign Application Priority Data

Jul. 22, 1997 (FR) .............................................. 97/09263

(51) Int. Cl.[7] .............................................. H01B 43/00
(52) U.S. Cl. .............................. 29/884; 29/830; 29/874; 29/887
(58) Field of Search ........................... 29/825, 829, 830, 29/846, 883, 884, 874, 877

(56) References Cited

U.S. PATENT DOCUMENTS

| | | | |
|---|---|---|---|
| 5,135,606 A | | 8/1992 | Kato et al. |
| 5,304,460 A | | 4/1994 | Fulton et al. |
| 5,376,226 A | | 12/1994 | Lau et al. |
| 5,379,515 A | * | 1/1995 | Kondo et al. |
| 5,454,161 A | | 10/1995 | Beilin et al. |
| 5,485,039 A | | 1/1996 | Fujita et al. |
| 5,681,647 A | | 10/1997 | Caillat |
| 5,879,530 A | | 3/1999 | Caillat |

FOREIGN PATENT DOCUMENTS

| | | | | |
|---|---|---|---|---|
| EP | 0 504 614 | | 9/1992 | |
| FR | 2 726 397 | | 5/1996 | |
| JP | 3-269971 | * | 12/1991 | .................. 29/830 |
| JP | 3-269972 | * | 12/1991 | .................. 29/830 |
| JP | 3-269973 | * | 12/1991 | .................. 29/830 |
| JP | 3-269974 | * | 12/1991 | .................. 29/830 |
| JP | 3-269975 | * | 12/1991 | .................. 29/830 |
| JP | 3-269976 | * | 12/1991 | .................. 29/830 |
| JP | 3-269977 | * | 12/1991 | .................. 29/830 |
| JP | 3-269978 | * | 12/1991 | .................. 29/830 |
| JP | 4-95371 | * | 3/1992 | .................. 29/830 |
| WO | WO 91/11833 | | 8/1991 | |

OTHER PUBLICATIONS

IBM Technical Disclosure Bulletin, vol. 36, No. 6a, pp. 129–130, "Micro Machined Chip C–4 Socket Interposer," Jun. 1993.

* cited by examiner

Primary Examiner—Carl J. Arbes
(74) Attorney, Agent, or Firm—Oblon, Spivak, McClelland, Maier & Neustadt, P.C.

(57) ABSTRACT

A process for manufacturing an anisotropic conducting film including an insulating film in which holes are formed. Conducting inserts are located in the holes. First ends of the inserts project from one side of the insulating film, from a substrate in which compartments are formed on one surface, corresponding to the distribution of inserts on the insulating film, the shape of the compartments being complementary to the shape of the first ends of the inserts. The manufacturing process includes the steps of using a substrate with compartments with a tipped finish, producing an insulating film above the substrate with holes facing the compartments, producing conducting inserts in the holes and the compartments, and separating the insulating film in which the conducting inserts are formed.

19 Claims, 5 Drawing Sheets

METHOD FOR MAKING AN ANISOTROPIC CONDUCTIVE COATING WITH CONDUCTIVE INSERTS

BACKGROUND OF THE INVENTION

1. Field of the Invention

This invention relates to a process for manufacturing an anisotropic conducting film with conducting inserts, in which at least one end of the inserts comprises a tip.

2. Discussion of the Background

In the micro-connections field, there are three main families of techniques for connecting chips or integrated circuits to an interconnection substrate, namely wire bonding, TAB connection and the "Flip Chip" technique. In the wire bonding technique, gold or aluminum wires are used to make the connections. The TAB (Tape Automated Bonding) connection uses an intermediate tape on which a conductors network is obtained by etching or chemical growth. According to the Flip Chip technique, chip input/output pins are connected by soldering or gluing onto the corresponding pins of a substrate. Flip Chip by soldering is done using meltable micro-bossings (also called balls). In the glued Flip Chip version, an anisotropic conducting film provides electrical conduction in z and good insulation in the xy plane.

Each of these techniques has advantages and disadvantages. From the point of the view of the contact quality obtained, the Flip Chip is by far the best technique, due to the limitation of the connection length obtained and due the soldering process itself. However, it involves a long and expensive process since it typically requires two lithography levels in order to define the location of the balls (bond metallurgy and balls).

The concept of the anisotropic conducting film, a sort of universal connector, eliminates lithography dedicated to each application and becomes very attractive. The main market targeted at the present time is for flat screens with the difficult problem of the connection of pixel control chips on the liquid crystal screens themselves. This conducting film is usually a filled epoxy glue which, as it cross-links, puts conducting fillers and the pins to be connected into contact in the z direction, while providing insulation in xy. The reliability and quality of these connections are well below the specifications for many applications, since 10% of flat screens for portable computers are recycled.

It is known how to make an electrical connection between the pins of a chip and the pins of an interconnection substrate facing it, using a conducting glue or an anisotropic conducting film by contact. This type of film or glue provides electrical contact in the z direction by compression of conducting particles incorporated in the polymer matrix forming the glue or the film. This compression may be applied mechanically from the outside, or may be obtained by cross-linking the glue itself which then shrinks. In both cases, the contact resistance is relatively high, and more importantly is not reproducible. In most cases, a finishing operation is necessary on the pins to be brought in contact. This is done by deposition of a gold or SnPb alloy plating on the pins. This finish improves the final contact resistance obtained. The particles can quickly be coated with a gold, silver or nickel surface layer.

A significant improvement to this anisotropic conducting film has been proposed. It consists of using nickel conducting particles that have a particular shape consisting of a sort of ball on which sharp protuberances are formed. The protuberances penetrate the oxide layer present on the surface of the pin to be connected at the time of assembly.

Anisotropic conducting films with a meltable base are also known. In this case, meltable particles, or particles covered with a meltable material, are used in a polymer matrix resisting high temperatures (for example a polyimide matrix). The pins to be connected are usually made of aluminum with a finish that can be soldered (Ni/Au or SnPb alloy). The meltable material from which the particles are made melts under pressure and/or by increasing the temperature to several hundred degrees (for example $\geq 200°$ C.), producing electrical contacts between the pins facing the chip and the interconnection substrate. Note that it is very difficult to solder particles through the polymer film simply by applying pressure-heating since the polymer surface quickly prevents satisfactory soldering of the balls to each other or onto the pins. In most cases, the improvement made using this technique is due to the good plasticity of the meltable material which, as it deforms, improves the presence of an electrical contact.

Another technique for obtaining an anisotropic conducting film consists of depositing a layer of meltable material on the pins of the chip and a layer of polyimide between the aluminum pins of the interconnection substrate. The chip and the substrate are then assembled, with the pins to be connected facing each other, by applying pressure and increasing the temperature ($\geq 200°$ C.). The disadvantage of this type of technique is that opening masks are necessary above the pins firstly to deposit the meltable material on the chip and secondly, the polyimide material onto the interconnection substrate. Therefore, the universal aspect of the anisotropic conducting film is lost.

Another anisotropic conducting film structure is known as VIS (Vertical Interconnection Sheet). This type of structure comprises an insulating film provided with conducting studs passing through the thickness of the film. FIG. 1 shows this type of structure, in a version called the "hard" contact version. The structure is shown between two elements to be assembled; an interconnection substrate 2, provided with pins 6 and 8, and a chip 4 provided with pins 10 and 12. The structure must form the electrical bond between firstly pins 6 and 10, and secondly pins 8 and 12. It comprises a polyimide film 30 provided with projecting studs 32. This type of structure is obtained by localized etching of a copper plate subjacent to the polyimide film and by electrolytic growth of gold. The chip is assembled on the substrate using this VIS structure by compression. The disadvantage of this structure is that the production processes lead to relatively large pitches p between studs (of the order of 40 μm). Another disadvantage is that the electrical bond by contact with the projecting gold studs does not enable bond of the polyimide film on the chip surface.

A similar structure is described in patent U.S. Pat. No. 5,304,460, illustrated in FIG. 2, in which an etched polymer film 34 is positioned between the chip 4 and the interconnection substrate 2, in the holes in which a meltable material 36 was evaporated. Subsequently, the studs 36 made of a meltable material are compressed between pins 6 and 10, and between pins 8 and 12. Depending on the nature of the polymer, there may be an adhesive effect of the polymer on the surface of the pin to be brought into contact. However, this adhesive effect is only obtained on the surface of the pins and not between the pins (for example in the intervals 35 and 37). Furthermore, preparation of the polymer in which a meltable material is evaporated to make the studs must be done beforehand on a support. The polymer layer then has to be separated from this support without removing the meltable material 36, which requires a cold process. Finally, the bond is still a "contact" type since it is obtained by compression of the studs on the pins. Consequently, the contact remains mediocre even with a meltable material.

Document FR-A-2 726 397 discloses an anisotropic conducting film comprising a polymer layer 46 in which crossing conducting studs are provided, as shown in FIG. 3. The central part 52 of the studs is composed of a hard material (for example copper, nickel or an SnPb alloy meltable at high temperature). The ends 44 and 54 of the studs are composed of a meltable material (for example an SnPb alloy meltable at low temperature). The anisotropic conducting film in FIG. 3 will provide electrical connections between the pins 10 and 12 of chip 4 and between pins 6 and 8 of the interconnection substrate 2. These pins are covered by bond layers 56, 58, 60 and 62 to solder or bond the meltable materials 44 and 54. The electrical connection of the chip onto the substrate is made by increasing the temperature and possibly by applying pressure between the chip 4 and the substrate 2. The ends of the studs that are in contact with the bond layer present on the pins combine with this layer. This results in a reduction in the height of the studs between a pin on the chip and the pin facing the substrate. This height is gradually modified until it is equal to the height of the central part 52 of the studs. This phenomenon does not occur for the other studs, that are not facing a bond layer. The pitch of the studs obtained by the method described can be very small, but the pins to be connected have to be pre-treated so that they can be soldered if a good electrical contact is to be obtained and to maintain the benefit achieved by soldering the studs.

Patent U.S. Pat. No. 5,135,606 discloses processes for making VIS structures with adapted stud shapes. The described processes are suitable for producing VIS structures from a basic copper support. They can be used to obtain a tipped shape at the projecting ends of the studs or inserts. However, the tipped shape of the inserts is obtained by electrolytic growth in a resin comprising conical openings. This type of process cannot be used to produce tips with uniform slopes since the slopes of the patterns of the resin are not uniform themselves, firstly due to the use of chemical etching, and secondly due to the use of insolation with variable focusing. Furthermore, the shape of the tips obtained by this type of process cannot be reproduced from one tip to the next, and the result is a flattened vertex due to the fact that the mask opening cannot be completely closed to enable the electrolyte to pass.

For all these anisotropic conducting films according to prior art, note that:

if meltable particles or studs are used, a finish that can be soldered will be necessary on the pins to be connected, and therefore an additional layer will have to be deposited on these pins;

this finish is not necessary if the shape of the conducting particles is aggressive, but since the density of conducting particles is limited in the polymer matrix, problems will arise when the pitch between the pins to be connected is small or when a high current has to be passed.

Patent U.S. Pat. No. 5,135,606 describes structures with a variety of shapes of projecting studs. However, these structures appear to be very difficult to implement, particularly for the variant with projecting tipped studs.

SUMMARY OF THE INVENTION

This invention proposes a process for manufacturing an anisotropic conducting film with conducting inserts at a pitch that can be very small, these inserts having at least one end in the shape of a tip. The proposed process is simple and reproducible. It is based on the transfer of tips obtained on a substrate, for example in a chemical etching process, by electrolysis, atomization or evaporation.

The anisotropic conducting film obtained by this process can be used to mount a structure such as a chip (for example an integrated circuit) directly on the interconnection substrate, without any special processing being necessary for the pins of the chip. If the pins in the interconnection substrate are provided with a copper finishing layer, or a gold or SnPb finishing layer, there is no need for the inserts to have a tipped end on this side. Since pins on chips are usually made of aluminum without a finishing layer, the tips of the inserts will be on this side.

Therefore, the purpose of the invention is a process for manufacturing an anisotropic conducting film comprising an insulating film in which holes are formed, conducting inserts being located in the holes, the first ends of the inserts projecting from one side of the insulating film, from a substrate in which compartments are formed on one surface, corresponding to the distribution of inserts on the insulating film, the shape of the compartments being complementary to the shape of the first ends of the inserts, characterized in that it comprises the following steps:

a) use of a substrate with compartments with a tipped finish, b) production of the insulating film above the substrate with holes facing the compartments, c) production of conducting inserts in the holes and the compartments, d) separation of the insulating film in which the conducting inserts are formed.

The substrate may be a single crystal and the compartments may be formed by etching, with at least the bottom of the compartments being etched along determined crystallographic planes.

The substrate may be made of silicon. The etching step may consist of chemical etching along the crystallographic plane (111) of a substrate starting from a face with a crystallographic plane (110).

A sacrificial layer matching the surface of the substrate can be deposited between step a) and step b), the insulating film being deposited on the sacrificial layer. In this case, the separation step may be made by chemical etching of the sacrificial layer. This chemical etching of the sacrificial layer may be complemented by a capillary effect.

Since the sacrificial layer is made of a conducting material, step c) may consist of making the conducting inserts grow by electrolysis in the compartments and the holes, using the sacrificial layer as an electrode.

Since the substrate is a conducting or doped semiconductor material, step c) may consist of making the conducting inserts grow by electrolysis in the compartments and the holes using the substrate as an electrode.

Step c) may consist of atomization or evaporation of the conducting material(s) that will form the inserts, in the compartments and the holes. In this case, the atomization or evaporation step may consist firstly of positioning a mask provided with holes at a given distance from the insulating film, the holes in the mask being in line with the compartments in the substrate and the holes in the film, and with a determined initial diameter, and then atomizing or evaporating the conducting material(s) forming the conducting inserts, through the holes in the mask. The said determined initial diameter of the holes in the film may be such that the second ends of the inserts also terminate in tips, due to the reduction in the initial diameter due to atomization or evaporation.

The separation step d) may use mechanical forces.

Step a) and step b) may consist firstly of depositing the insulating film on top of the substrate, possibly covered with a sacrificial layer in which compartments are not yet formed on the surface, and then positioning a mask in which holes are formed in a pattern corresponding to the distribution of inserts in the film, and then etching firstly the insulating film and possibly the sacrificial layer to form holes in it, and secondly the substrate to form compartments in it, through the holes in the mask, and finally eliminating the mask. In this case, if the inserts are made by electrolysis, a layer of conducting material matching the etched areas of the substrate may be deposited after the holes have been etched in the insulating film and before the mask is eliminated.

Advantageously, the first ends of the conducting inserts are made from a hard material. Consequently, these ends can penetrate through the oxide layer covering the pin to be connected. The inserts may be made entirely of this hard material. As a variant, a hard material may be used only for the projecting part of the inserts.

The insulating film may be a thermoplastic polymer film or a multi-layer film with thermoplastic outer layers. This can provide a self-sticking function at the time of the assembly. Otherwise, a layer of glue should be provided on it before assembly.

The cross-section of the holes etched in the insulating film may be smaller than the cross-section of the compartments on the said surface of the substrate. The result is that the inserts are embedded in the insulating film.

BRIEF DESCRIPTION OF THE FIGURES

In any case, the characteristics and advantages of the invention will become more obvious after reading the following description that relates to example embodiments given for explanatory purposes and in no way restrictive, with reference to the attached drawings in which.

DESCRIPTION OF THE PREFERRED EMBODIMENTS

A manufacturing process for an anisotropic film according to this invention is illustrated in FIGS. 4A to 4F.

Figure 1:
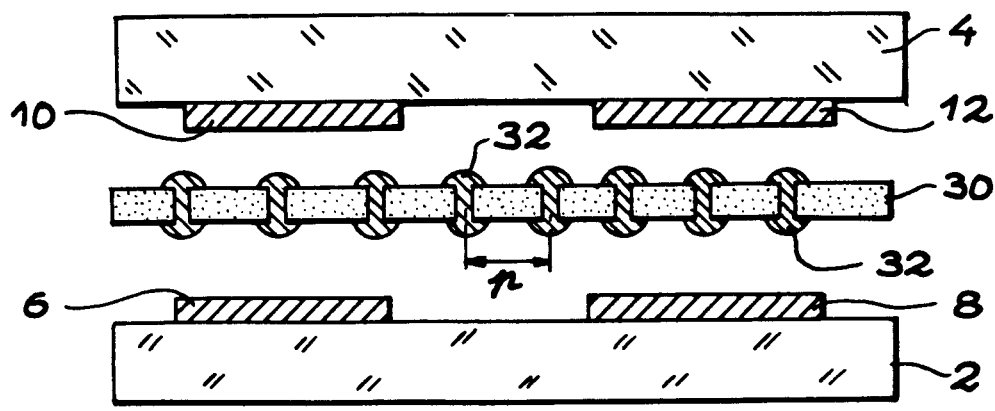
FIGS. 1 to 3, already described, represent bonding by an anisotropic conducting film according to prior art.
Figure 2:
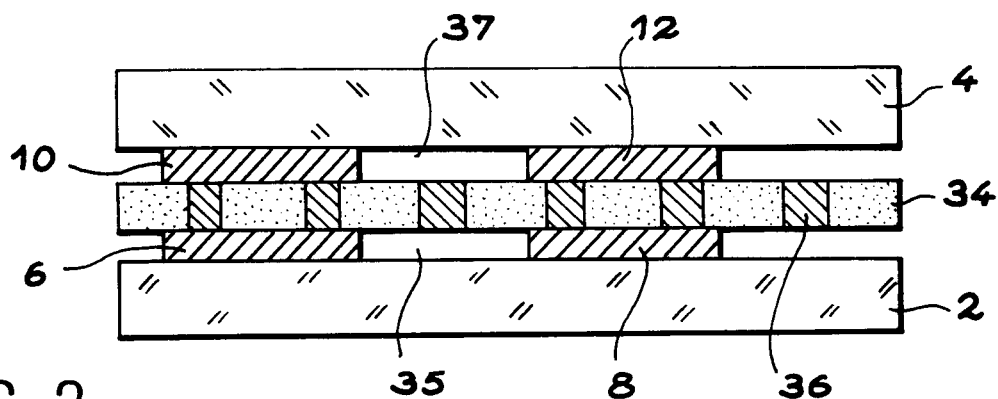
Figure 3:
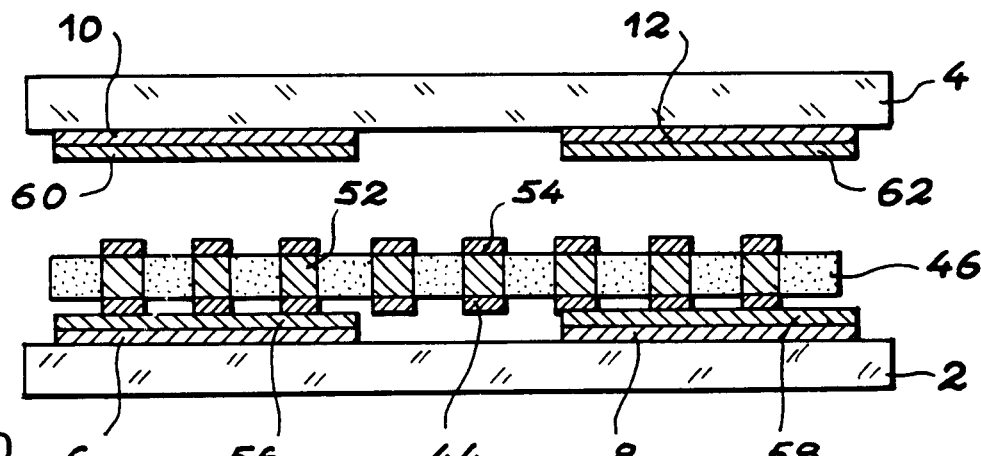
Figure 4:
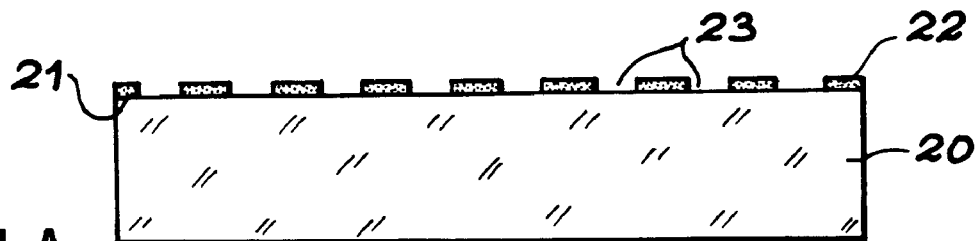
FIGS. 4A to 4F illustrate a first variant of the manufacturing process for an anisotropic conducting film according to this invention, FIG. 5 contains a top view and a sectional view along line V—V in FIG. 4E, of one insert and its immediate environment.
Figure 4:
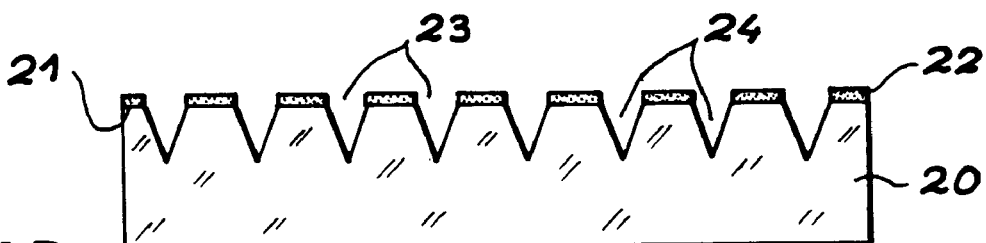
Figure 4:
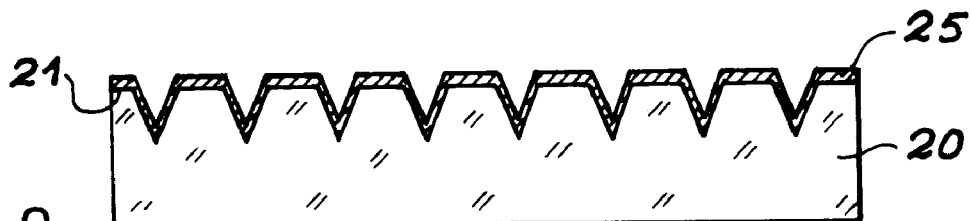
Figure 4:
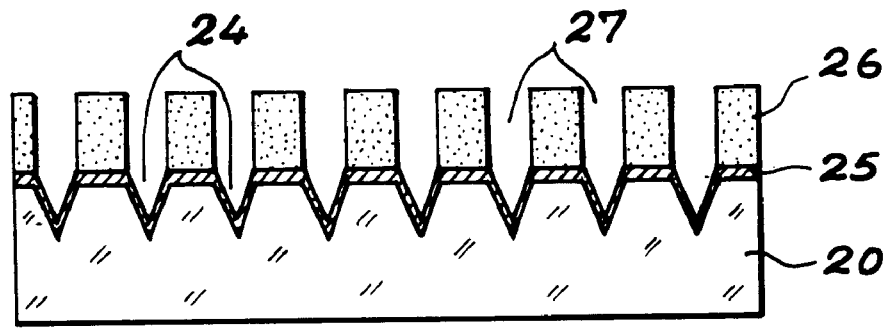
Figure 4:
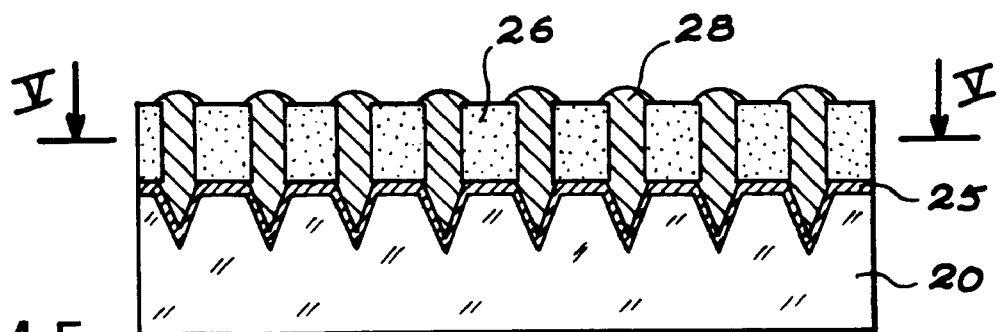
Figure 4:
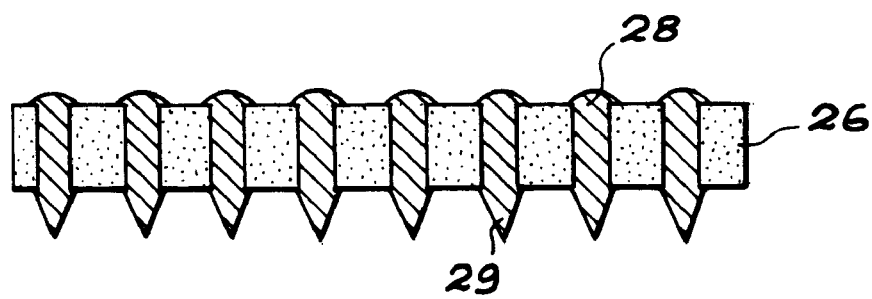

The first step in this process consists for example of etching a silicon substrate 20. This is done by adding a mask 22 (made of silicon nitride or gold) to cover the plane surface 21 of the substrate 20 with a crystallographic plane (110). The mask 22 is etched using a lithography technique such that the face 21 of the substrate 20 can be seen through openings 23 (FIG. 4A). The visible parts of the plane face 21 are then chemically etched (for example using KOH) along crystallographic planes (111). This produces compartments 24 with a square cross-section (FIG. 4B).

The remaining parts of mask 22 are then removed and a sacrificial layer is deposited, for example a conducting layer, 25 on the etched face 21 of substrate 20 (FIG. 4C). This layer 25 may be made of Cu, Ti, Ni or SnPb. Its thickness (for example 0.1 to 3 $\mu$m) is such that it matches the profile of the etched face 21.

A polymer layer 26 (for example a 10 $\mu$m thick polyimide layer) is deposited on the metallic layer 25. This layer 26 is etched using a photolithographic technique to form circular holes 27 and is in line with the compartments 24 in the substrate 20 (FIG. 4D).

The metallic inserts 28 are built up from the bottom of the compartments 24 as far as the top face of the polymer layer 26, passing through the holes 27, by electrolytic growth in a single step, using the metallic layer 25 as the electrode. The metal from which the inserts 28 are formed may be nickel or copper (FIG. 4E).

The final step consists of chemically etching the metallic layer 25 in order to separate the insulating film 26 in which the inserts 28 are located (FIG. 4F).

Figure 5:
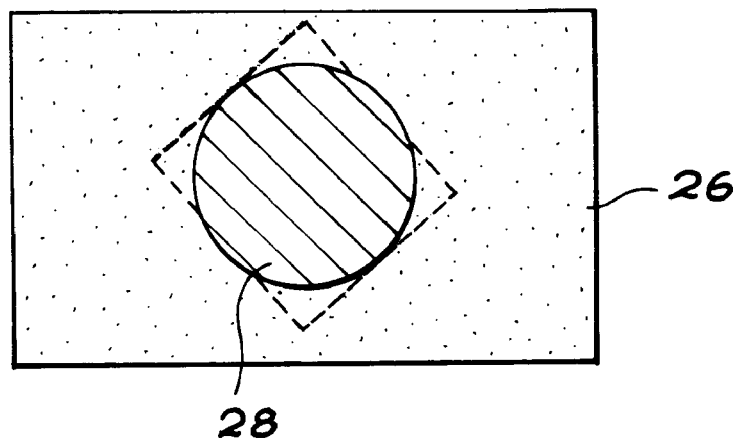

The silicon substrate was etched such that the etched compartments are pyramid-shaped with a square cross-section. Therefore, the tips 29 of the inserts 28 also have the same shape. The cross-sections of the holes 27 formed in the insulating film 26 are circular. Since the cross-section of the holes 27 is smaller than the cross-section of the compartments 24 in the face 21 of the substrate 20, the inserts may be embedded in the insulating film 26. This is shown in FIG. 5.

Once the first anisotropic conducting film has been made according to this process, separation of the film leaves an etched substrate that can be used again to make a new film.

Another process for producing an anisotropic conducting film according to this invention will now be described. Until the insulating film is opened, the steps in this process are the same as the steps in the process described above. Therefore, all that will be described are the steps after the steps that were used to produce the structure shown in FIG. 4D. A mask 15 in which holes 16 are formed is then positioned on this structure at a determined distance from the insulating film 26. The holes 16 in the mask 15 correspond to the compartments of the substrate 26 and are in line with the compartments. The distance d separating the mask 15 from the insulating film 26 and the diameter of the holes 16 are chosen so as to obtain the desired inserts.

Figure 6A:
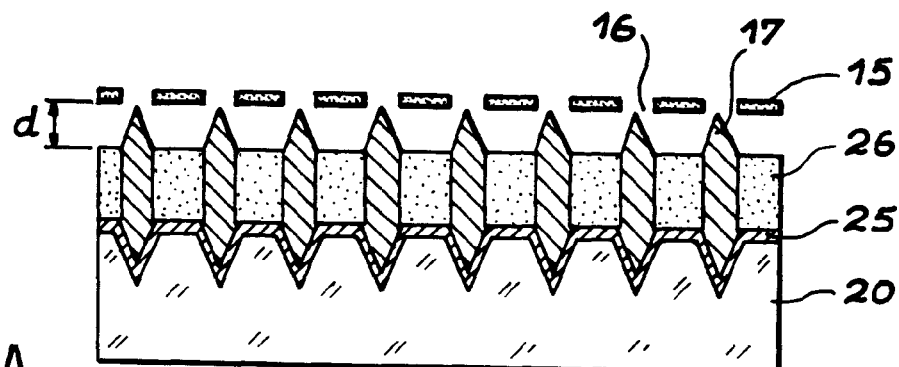
FIGS. 6A and 6B illustrate a second variant of the manufacturing process for an anisotropic conducting film according to this invention.

Metal intended to form inserts (for example nickel or copper) is then atomized or evaporated through holes 16 in the mask 15. The diameter of the holes 16 reduces as the metallic deposition takes place. The result is that if the distance d and the diameter of the holes 16 are correctly chosen (by calculation or by experiments), the shape of the ends 17 of the inserts located close to mask 15 is tipped (FIG. 6A).

Figure 6B:
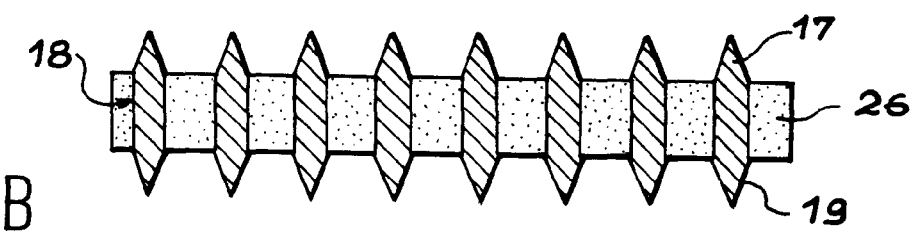

The next step is to separate the insulating film 26 by chemical etching of the conducting layer 25, for example using hydrofluoric acid. FIG. 6B shows the result obtained. The anisotropic conducting film comprises inserts 18 with first ends 19 that match the shape of the compartments in the substrate and second ends 17 in the shape of tips but with a circular cross-section.

Figure 7A:
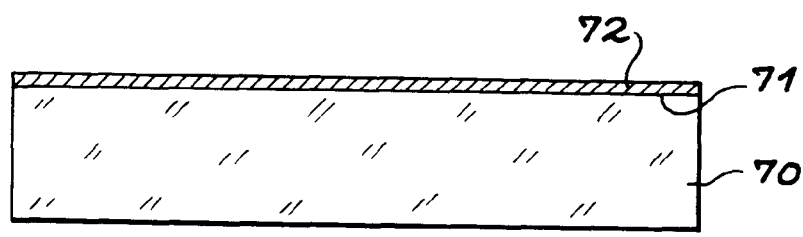
FIGS. 7A to 7F illustrate a third variant of the manufacturing process for an anisotropic conducting film according to this invention.

Another process for producing an anisotropic conducting film according this invention will now be described with reference to FIGS. 7A to 7F. The starting point is a silicon substrate 70 with one plane face 71 along a crystallographic plane (110). A layer of conducting material 72 (for example a 0.1 to 3 $\mu$m thick layer of Cu, Ti, Ni or SnPb) is deposited on the plane surface 71 (FIG. 7A).

Figure 7B:
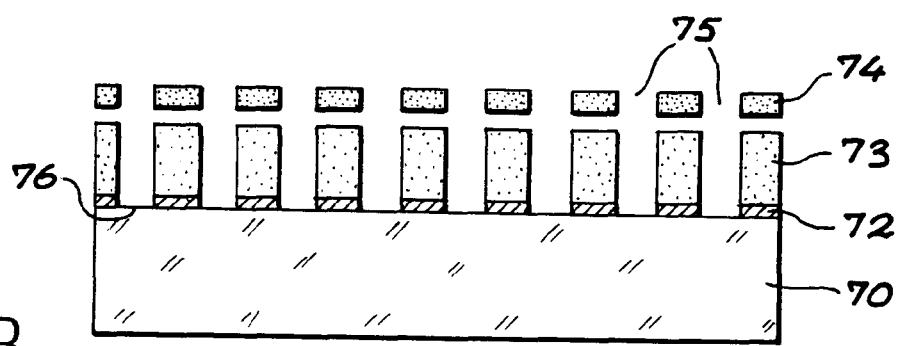

A polymer layer 73 (for example a 10 μm thick layer of polyimide) is then deposited on layer 72. A mask 74 is positioned above the polymer layer 73. This mask 74 is provided with holes 75 according to a pattern corresponding to the desired distribution of the inserts. An etching operation is carried out through holes 75 that exposes the areas 76 of the substrate corresponding to the holes 75 in the mask 74 (FIG. 7B).

Figure 7C:
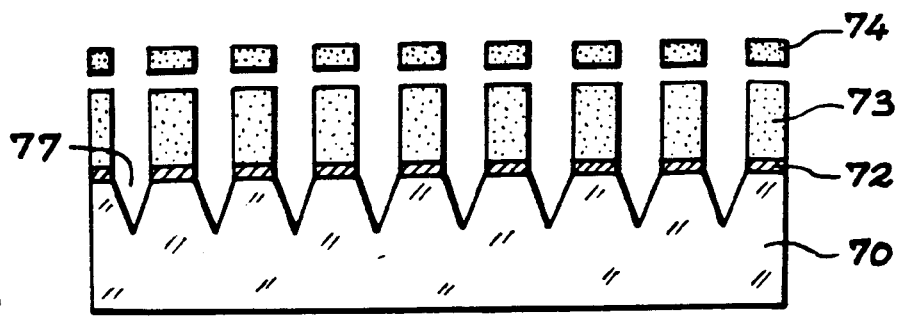

The substrate 70 is then chemically etched along crystallographic planes (111). This produces compartments 77 with a square cross-section (FIG. 7C).

Figure 7D:
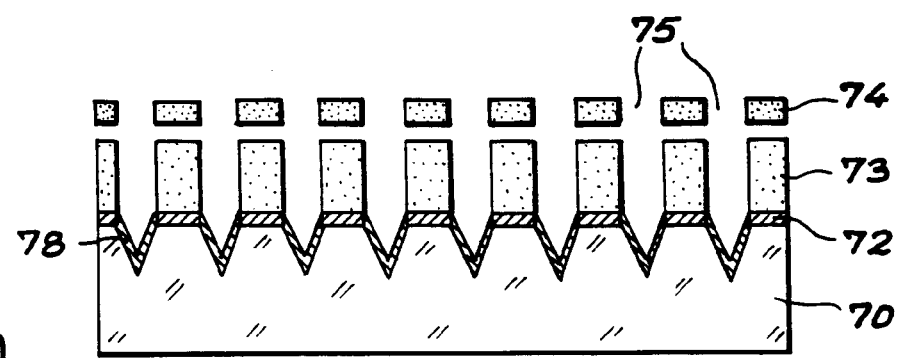

Finally, another metallic layer 78 is then deposited through the holes 75 in mask 74 onto substrate 70. This gives a continuous metallic coating on this face of the substrate matching the etched surface of the substrate 70 and composed of layers 72 and 78 (FIG. 7D).

Figure 7E:
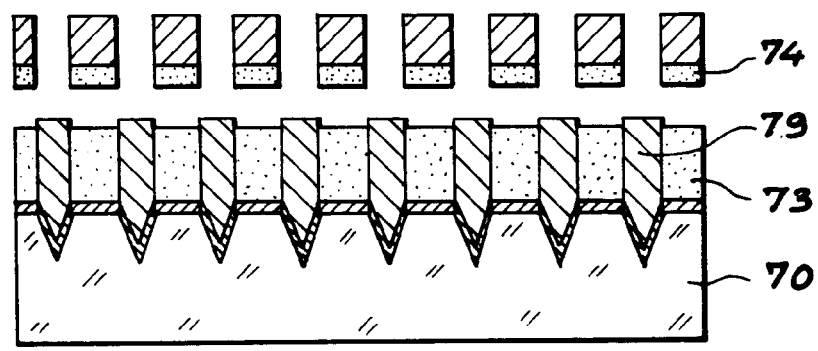

The inserts 79 may then be formed by evaporation or atomization of metal (for example nickel or copper) through the holes in mask 74, the metal also depositing on this mask (FIG. 7E). Similarly, this metal bottom 72 and 78 may be used to grow the inserts as described above (combination) by electrolysis.

Figure 7F:
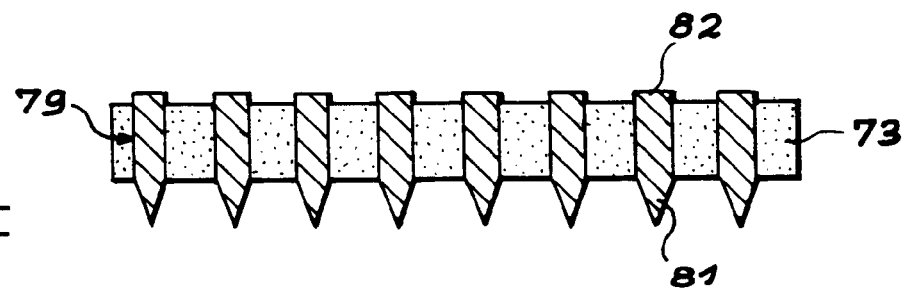

The mask is removed and the insulating film 73 is separated as described above. FIG. 7F shows the result obtained. The anisotropic conducting film comprises inserts 79 with first ends 81 reproducing the shape of the compartments in the substrate and with second flat ends 82.

According to this final process, the mask 74 is independent of the polymer film 73. It is simply added on top of it. It may also be constructed on the polyimide layer using conventional micro-electronic techniques (for example a gold layer resistant to KOH etching).

When a first anisotropic conducting film has been made according to this process, separation of the film leaves an etched substrate. This etched substrate can be reused for example according to the process described above in relation to FIGS. 4A to 4F. This etched substrate can also be reused with the last process described. By depositing a metallic layer (replacing layers 72 and 78) on the etched substrate, and then a polymer layer (replacing layer 73). By replacing mask 74 in which holes 75 are formed, the polymer layer is etched in order to arrive at the situation shown in FIG. 7D.

When preferential silicon etching is used, a perfectly defined and very sharp tip is obtained. The problem of the electrical quality of the contact is solved, with contact resistances of less than 20 mΩ easily achievable on an aluminum pin.

If a non-thermoplastic polymer is used to form the insulating film, the tips of the inserts can be used to maintain a small space between the film and the chip to be connected, which leaves a glue film on all surfaces to be put into contact, and therefore excellent mechanical strength.

The processes described above can be used to produce very small inserts; 1 to 2 μm diameter for a pitch of 4 to 5 μm, which enables interconnection of chips with inputs/outputs at a very small pitch.

The inserts obtained by these processes may be embedded in the insulating film, giving good cohesion of the assembly.

The silicon substrate forms a "mold" so that all tips can be at the same level. Production of the inserts starts with the tips, unlike some processes according to known art in which the tips are added onto the body of the insert. This thus avoids nonuniformities due to intermediate operations in which the insert bodies are produced.

The process according to the invention can also use combinations of the embodiments described above. In particular, the conducting inserts may be made partly by electrolysis and finished by atomization or evaporation, particularly to make the second tipped ends.

Unlike the VIS techniques according to prior art, the principle according to the invention can be used firstly to produce inserts with tipped ends, and secondly to reuse the substrate for other conducting films, since it is not sacrificed during production of the conducting film.

What is claimed is:

1. A process for manufacturing an anisotropic conducting film comprising an insulating film in which holes are formed, conducting inserts being located in the holes, the first ends of the inserts projecting from one side of the insulating film, from a substrate in which compartments are formed on one surface, corresponding to the distribution of inserts on the insulating film, the shape of the compartments being complementary to the shape of the first ends of the inserts, the process comprising the steps of:

a) using a substrate with compartments with a tipped finish, b) producing the insulating film above the substrate with holes facing the compartments, c) producing conducting inserts in the holes and the compartments, d) separating the insulating film, in which the conducting inserts are formed, from the substrate which is reusable for manufacturing other anisotropic conducting films.

2. A process according to claim 1, in which the substrate is a single crystal and in which the compartments are formed by etching, at least the bottom of the compartments being etched along determined crystallographic planes.

3. A process according to claim 2, in which the substrate is made of silicon.

4. A process according to claim 3, in which the etching step comprises chemical etching along the crystallographic plane (111) of a substrate starting from a face with a crystallographic plane (110).

5. A process according to claim 1, in which a sacrificial layer matching the surface of the substrate is deposited between step a) and step b), the insulating film being deposited on the sacrificial layer.

6. A process according to claim 1, in which step b) comprises depositing an insulating film on the substrate and etching the said film to form holes in line with the compartments in the substrate and that will contain the conducting inserts.

7. A process according to claim 5, in which the sacrificial layer is made of a conducting material, step c) comprises making the conducting inserts grow by electrolysis in the compartments and the holes, using the sacrificial layer as an electrode.

8. A process according to claim 1, in which the substrate is a conducting or doped semiconductor material, step c) comprises making the conducting inserts grow by electrolysis in the compartments and the holes using the substrate as an electrode.

9. A process according to claim 1, in which step c) comprises atomization or evaporation of the conducting material(s) that will form the inserts, in the compartments and the holes.

10. A process according to claim 9, in which the atomization or evaporation step comprises substeps of:

positioning a mask provided with holes at a given distance from the insulating film, the holes in the mask being in line with the compartments in the substrate and the holes in the film, and with a determined initial diameter, atomizing or evaporating the conducting material forming the conducting inserts, through the holes in the mask.

11. A process according to claim 10, in which the said determined initial diameter of the holes in the film is such that the second ends of the inserts also terminate in tips, due to the reduction in the initial diameter due to atomization or evaporation.

12. A process according to claim 5, in which the separation step d) is made by chemical etching of the sacrificial layer.

13. A process according to claim 12, in which the chemical etching of the sacrificial layer is complemented by a capillarity effect.

14. A process according to claim 1, in which the separation step d) uses mechanical forces.

15. A process according to claim 1, in which step a) and step b) comprise the substeps of:

depositing the insulating film on top of the substrate, possibly covered with a sacrificial layer, in which compartments have not yet been formed on the surface, positioning a mask in which holes are formed in a pattern corresponding to the distribution of inserts in the film, etching firstly the insulating film and possibly the sacrificial layer to form holes in it, and secondly the substrate to form compartments in it, through the holes in the mask, eliminating the mask.

16. A process according to claim 15, in which the inserts are made by electrolysis, a layer of conducting material matching the etched areas of the substrate is deposited after the holes have been etched in the insulating film and before the mask is eliminated.

17. A process according to claim 1, in which the first ends of the conducting inserts are made from a hard material.

18. A process according to claim 1, in which the said insulating film is a thermoplastic polymer.

19. A process according to claim 1, in which the cross-section of the holes etched in the insulating film may be smaller than the cross-section of the compartments on the said surface of the substrate.

* * * * *